United States Patent [19]
Levitt

[11] Patent Number: 5,341,382
[45] Date of Patent: Aug. 23, 1994

[54] METHOD AND APPARATUS FOR IMPROVING FAULT COVERAGE OF SYSTEM LOGIC OF AN INTEGRATED CIRCUIT WITH EMBEDDED MEMORY ARRAYS

[75] Inventor: Marc E. Levitt, Sunnyvale, Calif.

[73] Assignee: Sun Microsystems, Inc., Mountain View, Calif.

[21] Appl. No.: 717,890

[22] Filed: Jun. 19, 1991

[51] Int. Cl.$^5$ ............................................. H04B 17/00
[52] U.S. Cl. ..................... 371/22.1; 364/488; 364/579; 364/580; 371/22.6
[58] Field of Search ............... 324/73.1; 364/488, 579, 364/580; 371/22.1, 22.6

[56] References Cited

U.S. PATENT DOCUMENTS

| | | | |
|---|---|---|---|
| 4,481,627 | 11/1984 | Beauchesne et al. | 371/22.6 X |
| 4,752,729 | 6/1988 | Jackson et al. | 324/73.1 |
| 4,937,765 | 6/1990 | Shupe et al. | 364/570 |
| 5,005,173 | 4/1991 | Martin | 371/22.6 |
| 5,130,645 | 7/1992 | Levy | 371/22.1 X |
| 5,132,974 | 7/1992 | Rosales | 371/22.3 |
| 5,144,230 | 9/1992 | Katoozi et al. | 371/22.6 X |
| 5,202,626 | 4/1993 | Pham | 371/22.6 X |
| 5,254,943 | 10/1993 | Momase | 324/73.1 X |
| 5,289,119 | 2/1994 | Schroeder | 324/73.1 X |

OTHER PUBLICATIONS

"Digital Systems Testing and Testable Design", Miron Abramovici, Melvin A. Breuer, and Arthur D. Friedman, Computer Science Press, pp. 343-346 and 364-381.

Primary Examiner—Edward R. Cosimano
Attorney, Agent, or Firm—Blakely Sokoloff Taylor & Zafman

[57] ABSTRACT

A method and apparatus for improving the testability of system logic of an integrated circuit having embedded memory arrays is disclosed. The embedded memory arrays are coupled to a binary constant generation and selection circuit which is also coupled to the system logic. During a test mode, the selection circuit sends a binary constant to the system logic in lieu of normal operational data output from the memory arrays. The system logic is tested while the binary constant is continuously applied.

29 Claims, 15 Drawing Sheets

METHOD AND APPARATUS FOR IMPROVING FAULT COVERAGE OF SYSTEM LOGIC OF AN INTEGRATED CIRCUIT WITH EMBEDDED MEMORY ARRAYS

BACKGROUND OF THE INVENTION

1. Field of the Invention

The present invention is related to the field of integrated circuits. More particularly, the present invention is a method and apparatus for improving fault coverage of system logic of an integrated circuit with embedded memory arrays.

2. Art Background

Many integrated circuits (ICs) 10 today have both system logic 12 and embedded memory arrays 14 on a single chip (FIG. 1 ). The system logic 12 consists of all elements other than the embedded memory arrays 14. The system logic 12 may comprise combinational logic, flip-flops and latches. The embedded memory arrays 14 may comprise random access memory (RAM), read only memory (ROM) and first-in first-out serial memory (FIFO).

Traditionally, the focus for reducing the high cost associated with testing complex integrated circuits 10 has been on the system logic 12. The system logic 12 of an integrated circuit 10 typically incorporates a form of scan-based design for testability, such as full serial integrated scan or isolated serial scan. The various forms of scan-based design are used to increase the controllability and observability of the system logic 12, the two key measures of testability. As a result of enhanced controllability and/or observability, higher fault coverage of the system logic 12 is achieved.

Controllability is the ability to establish a specific signal at each node in a circuit by setting values on the circuit's input. Observability is the ability to determine the signal value at any node in a circuit by controlling the circuit's input and observing its outputs. Fault coverage is the ratio between the number of faults detectable and the total number of faults in the assumed fault universe. For further description on testability and scan-based designs, see M. Abramovici, M. Breuer, and A. Friedman, *Digital System Testing and Testable Design*, Computer Science Press, 1990, pp. 343-346, 364-381.

Traditionally, no special effort is made to enhance the controllability and/or the observability of the embedded memory arrays 14 to improve the fault coverage of the system logic 12. The embedded memory arrays 14 are typically handled in one of three different ways:

1. The embedded memory arrays 14 simply output an unknown value (X), which is fed into the system logic 12 (FIG. 2a).

2. The embedded memory arrays 14 are surrounded with scan storage elements (SR) 16, such as flip-flops. The scan storage elements 16 are included in the scan chain (FIG. 2b).

3. The embedded memory arrays 14 are provided with a functional vector and outputs a test vector which is fed into the system logic 12 (FIG. 2c). The functional vector is loaded into the embedded memory arrays 14 in between scan vectors.

These traditional methods of handling the embedded memory all have draw backs. For the first method, the unknown values (Xs) feeding into the system logic tend to lower the fault coverage of the integrated circuit. For the second way, the extra scan storage elements impose additional hardware requirements and further delay the inputs and outputs of the embedded memory. For the third method, the loading of functional vectors may not be viable for an embedded memory with a relatively short fixed scan test cycle. Additionally, the loading of functional vectors may not be viable if the embedded memory arrays' controls bits are affected by the system logic.

As will be discussed, the present invention overcomes the disadvantages of the prior art and provides a method and apparatus for improving the fault coverage of system logic of an integrated circuit with embedded memory arrays by indirectly enhancing the controllability and observability of the system logic through enhancement to the controllability of the embedded memory arrays. The method and apparatus of the present invention achieves higher fault coverage of the system logic than the first aforementioned method, incurs less hardware/performance burden than the second method, and works with a relatively short fixed scan test cycle unlike the third method. Additionally, unlike the third method, the method and apparatus of the present invention also eliminates writing the functional vector by hand.

SUMMARY OF THE INVENTION

A method and apparatus for improving fault coverage of system logic of an integrated circuit with embedded memory arrays is disclosed which has particular application to digital system testing and integrated circuit design. The method and apparatus enhances the controllability of the embedded memory arrays. As a result, the controllability and observability of the system logic are enhanced, thereby improving the fault coverage of the system logic.

The method and apparatus relate to a modification of the embedded memory arrays such that their outputs into the system logic are unaltered during a normal mode of operation, and altered to a predetermined constant during a test mode of operation when the system logic is tested, whereby causing controllability of the embedded memory arrays to be enhanced. As a result, the controllability and observability of the system logic are enhanced, thereby substantially improving the fault coverage of the system logic without substantial increase in hardware and performance penalties.

Various approaches to modifying the embedded memory arrays are disclosed. The embedded memory arrays may be modified to achieve the desired controllability using multiplexor-based, gate-based or transistor-based binary constant generation/selection circuits. Alternatively, output latches or sense amplifiers of the embedded memory arrays may be modified to achieve the desired controllability.

DETAILED DESCRIPTION OF THE INVENTION

A method and apparatus for improving fault coverage of system logic of an integrated circuit with embedded memory arrays are disclosed which have particular application to digital system testing and integrated circuit design. In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 1:
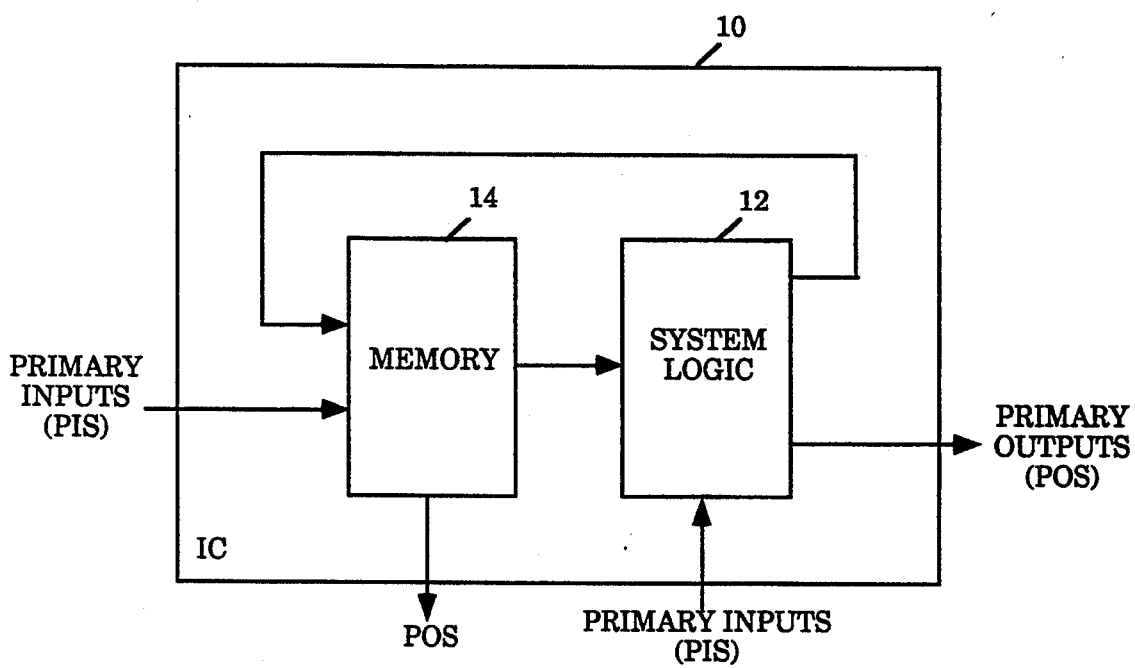
FIG. 1 shows a block diagram illustrating a typical integrated circuit with embedded memory arrays and system logic.
Figure 2A:
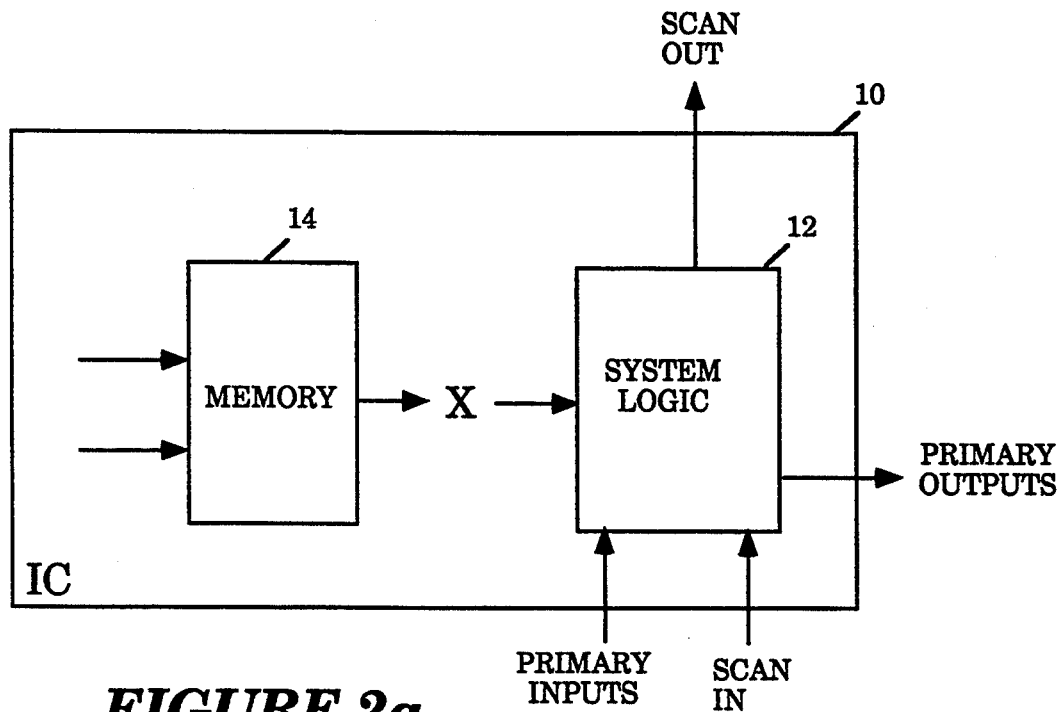
FIGS. 2a-2c show block diagrams illustrating the traditional approaches to handling the embedded memory arrays when testing the system logic.
Figure 2B:
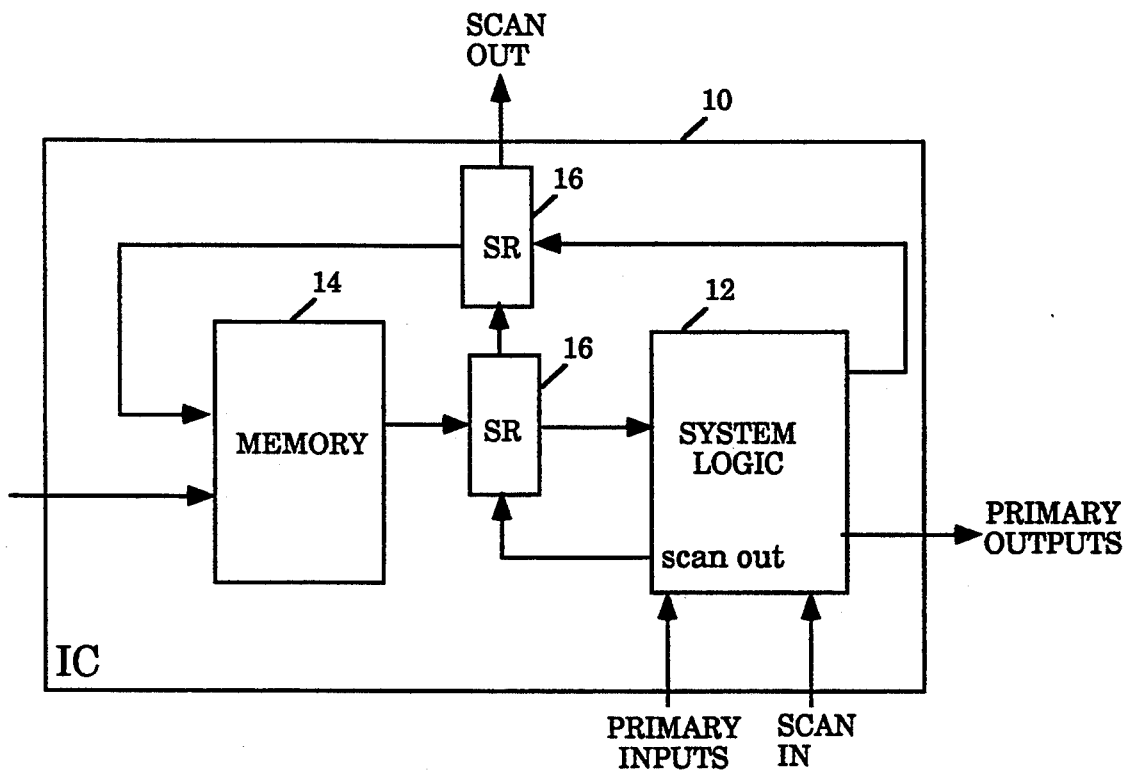
Figure 2C:
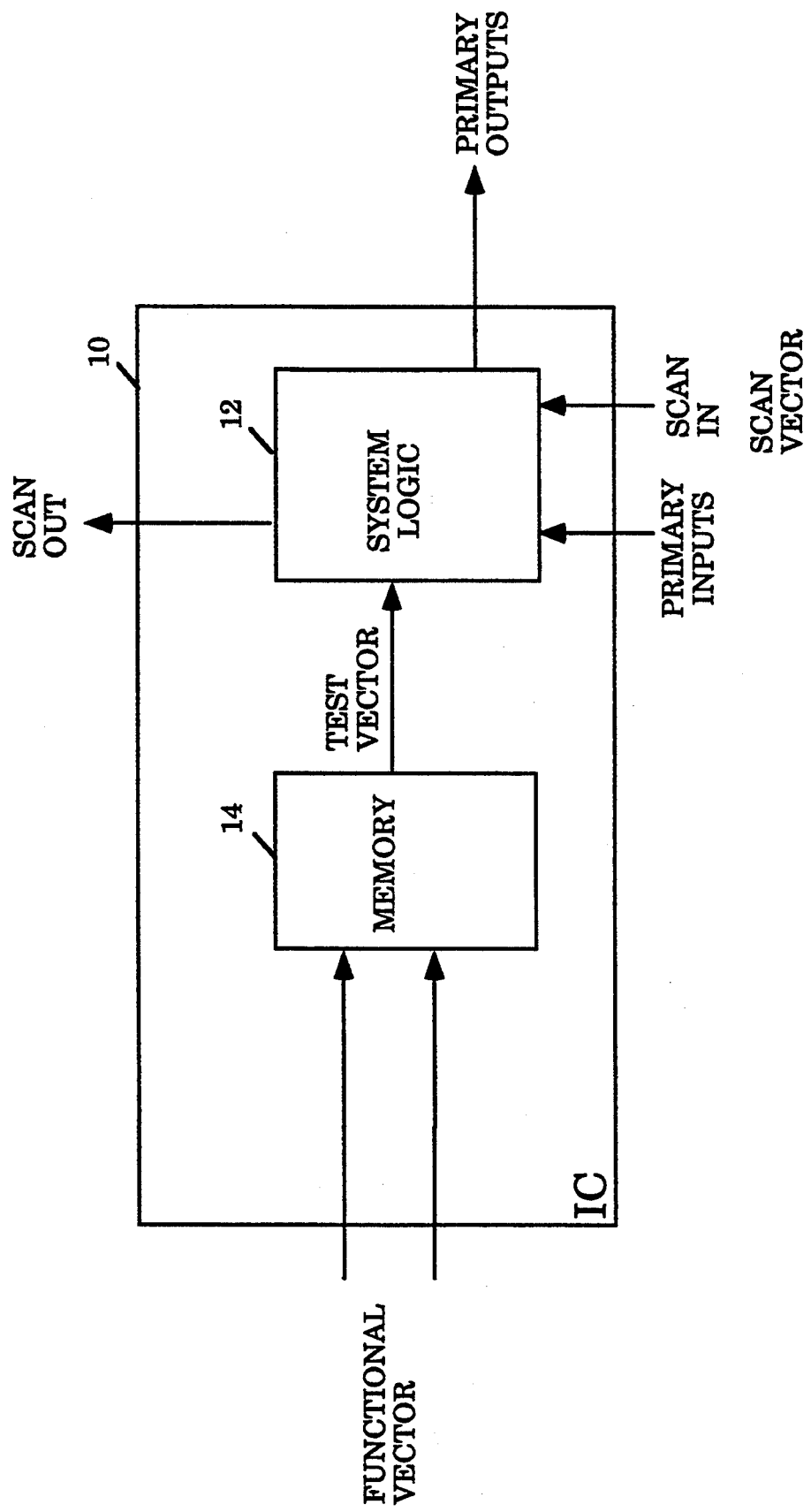
Figure 3:
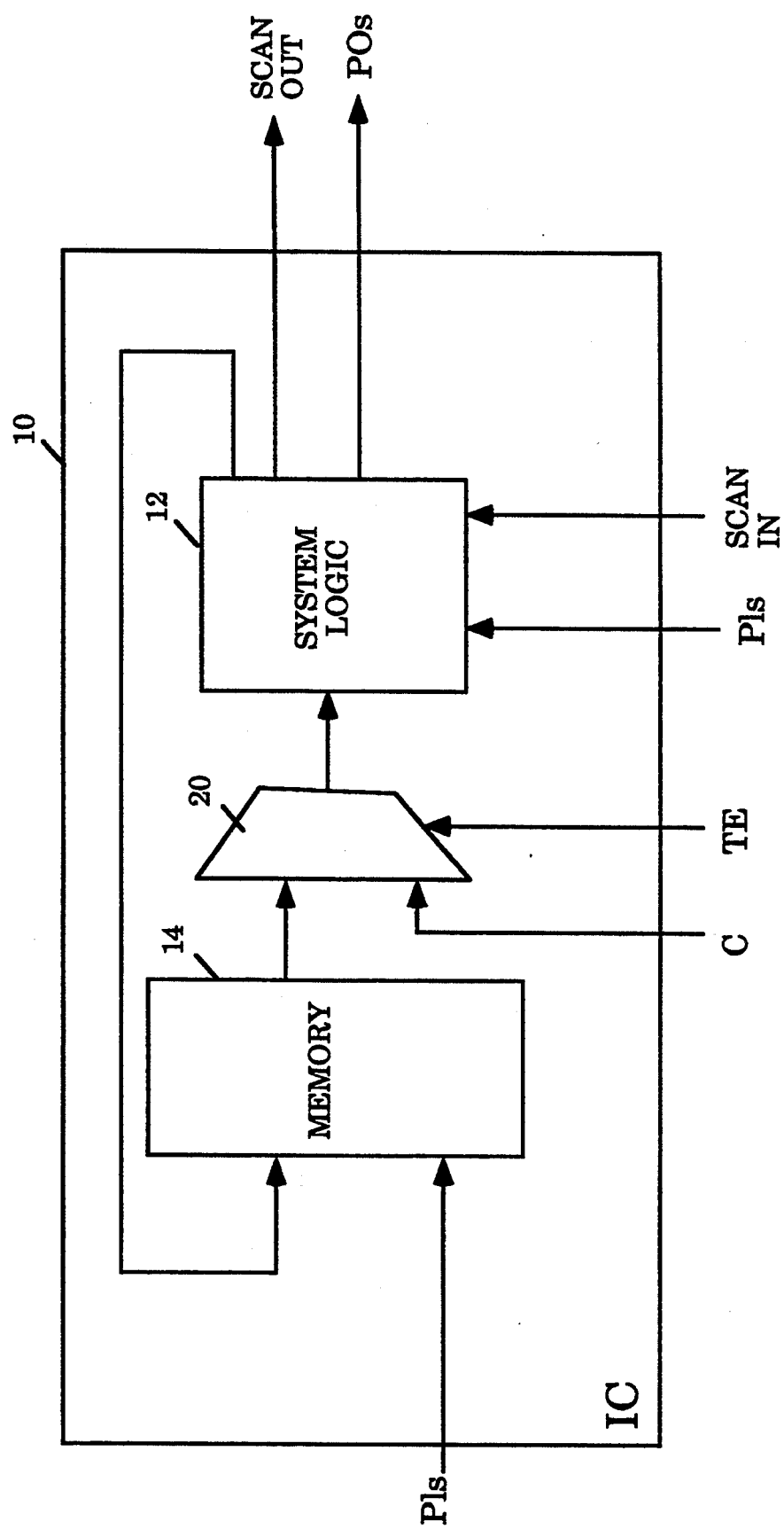
FIG. 3 shows a block diagram illustrating the method of the present invention where the embedded memory arrays are modified such that their outputs are unaltered during a normal mode of operation and altered to a predetermined constant during a test mode of operation.

Referring now to FIG. 3, a block diagram illustrating the method and apparatus of the present invention is shown. The method and apparatus enhances the controllability of the embedded memory arrays. As a result, the controllability and observability of the system logic is enhanced, thereby improving the fault coverage of the system logic. The method comprises the step of modifying the embedded memory arrays 14 such that their outputs into the system logic 12 are unaltered during a normal mode of operation, and altered to a predetermined constant during a test mode of operation when the system logic 12 is tested, whereby causing the controllability of the embedded memory arrays 14 to be enhanced. As a result, the controllability and observability of the system logic are enhanced, thereby substantially improving the fault coverage of the system logic 12 without substantial increase in hardware and performance penalties.

The step of modifying the embedded memory arrays 14 to achieve the desired controllability comprises the steps of coupling the embedded memory arrays 14 to a binary constant generation/selection circuit 20 in lieu of the system logic 12, and coupling the binary constant generation/selection circuit 20 to output to the system logic 12. The binary constant generation/selection circuit 20 is designed to generate/select the embedded memory arrays' output during the normal mode of operation (TE=0) and the predetermined constant (C) during the test mode of operation (TE=1) when the system logic 12 is tested.

Due to the wide variety of integrated circuits with embedded memory arrays and system logic on a single chip, there is no single preferred method of modifying embedded memory arrays to effectuate a desired controllability. A number of approaches will be discussed. It will be appreciated all the approaches discussed incur minimal increase in hardware or performance penalties.

Figure 4:
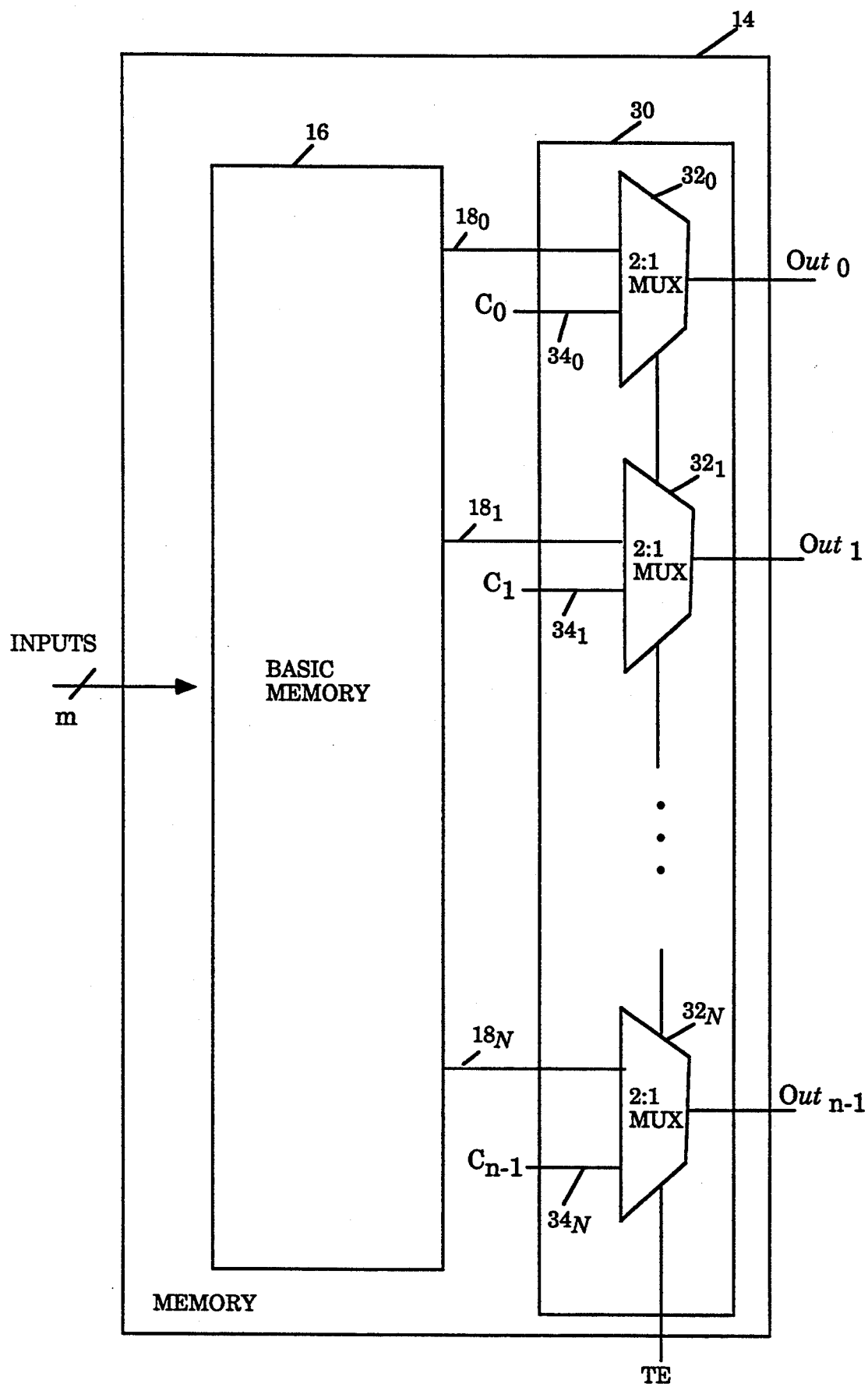
FIG. 4 shows a block diagram illustrating the method and apparatus of the present invention where the embedded memory arrays are modified to achieve the desired controllability using a multiplexor-based constant generation/selection circuit.

Referring now to FIG. 4, the embedded memory arrays 14 may be modified such that their outputs are unaltered during the normal mode of operation (TE=0) and altered to a predetermined constant during the test mode of operation (TE=1) using a multiplexor-based constant generation/selection circuit 30. The multiplexor-based constant generation/selection circuit 30 comprises a plurality of multiplexors $32_0$-$32_n$. For an embedded memory arrays 14 that outputs n bits, n multiplexors $32_0$-$32_n$ are required for the multiplexor-based constant generation/selection circuit 30.

Each of the output lines $18_0$-$18_n$ of the basic memory 16 of the embedded memory arrays 14 is coupled to one of the two input lines of the 2:1 multiplexors $32_0$-$32_n$. The other input lines $34_0$-$34_n$ of the 2:1 multiplexors 32 are coupled either to a drain, that is $V_{dd}$ or logic 1, or a source, that is $V_{ss}$ or logic 0, of the integrated circuit. An input line, e.g. $34_0$ for a particular 2:1 multiplexor, e.g. $32_0$, is coupled to a drain if the particular 2:1 multiplexor, e.g. $32_0$ is to output a bit having a value of one ("1-bit") for the predetermined constant during the test mode of operation (TE=1). An input line, e.g. $34_1$, for a particular 2:1 multiplexor, e.g. $32_1$, is coupled to a source if the particular 2:1 multiplexor, e.g. $32_1$, is to output a bit having a value of zero ("0-bit") for the predetermined constant during the test mode of operation (TE=1).

The 2:1 multiplexors $32_0$-$32_n$ are set to select the input lines $18_0$-$18_n$ coupled to the basic memory 16 during the normal mode of operation (TE=0) and the input lines $34_0$-$34_n$ coupled to a drain or source during the test mode of operation (TE=1), thereby generating/selecting the embedded memory's outputs unaltered during the normal mode of operation (TE=0) and the predetermined constant during the test mode of operation (TE=1).

Figure 5:
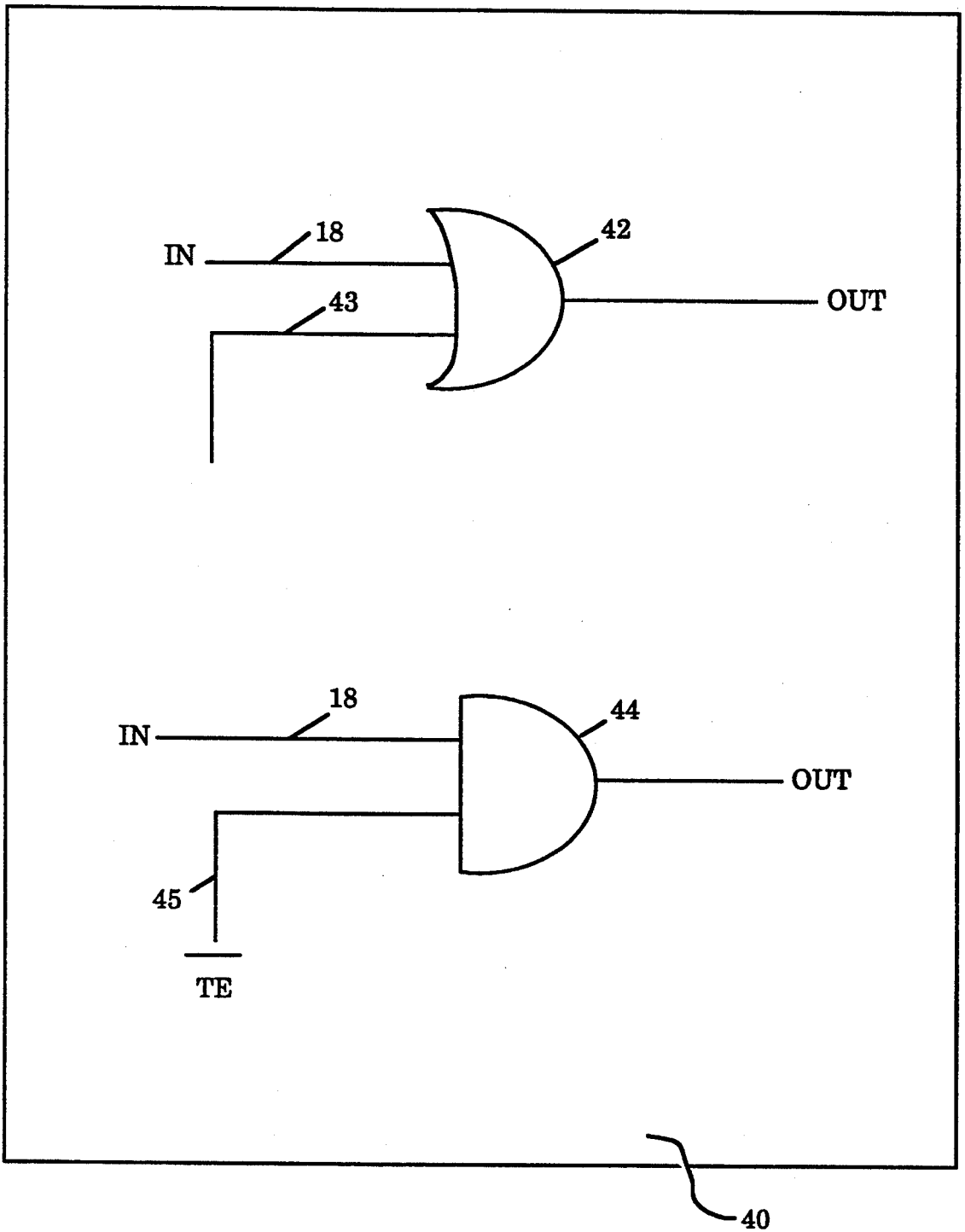
FIG. 5 is a block diagram illustrating the method and apparatus of the present invention where the embedded memory arrays are modified to achieve the desired controllability using a gate-based constant generation/selection circuit.

Referring now to FIG. 5, alternatively, the embedded memory arrays may be modified such that their outputs are unaltered during the normal operation (TE=0) and altered to a predetermined constant during the test operation (TE=1) using a gate-based constant generation/selection circuit 40. The gate-based constant generation/selection circuit 40 comprises a plurality of OR gates (one shown, 42) and a plurality of AND gates (one shown 44). For embedded memory arrays that output n bits, a total of n OR gates and AND gates are required for the gate-based constant generation/selection circuit 40.

Each of the output lines of the embedded memory arrays are coupled to either one of the OR gates, e.g. 42, or one of the AND gates, e.g. 44, depending upon the bit to be output during the test mode of operation. An output line from the embedded memory arrays is coupled to an OR gate, e.g. 42, if a 1-bit is to be generated in its replacement during the test mode of operation (TE=1). An output line from the embedded memory arrays is coupled to an AND gate, e.g. 44, if a 0-bit is to be generated in its replacement during the test mode of operation (TE=1).

During the normal mode of operation (TE=0), the other input line, e.g. 43, of an OR gate, e.g. 42, receives an 0-bit as input. If the output of the embedded memory arrays into the particular OR gate, e.g. 42, is a 1-bit, the particular OR gate, e.g. 42, generates/selects a 1-bit. If the output of the embedded memory into the particular OR gate, e.g. 42, is a 0-bit, the particular OR gate, e.g. 42, generates/selects a 0-bit. Therefore, the OR gates output their portions of the embedded memory arrays' outputs unaltered. On the other hand, the other input line, e.g. 45, of an AND gate, e.g. 44, receives a 1-bit as input. If the output from the embedded memory arrays into the particular AND gate, e.g. 44, is a 1-bit, the particular AND gate, e.g. 44, generates/selects a 1-bit. If the output from the embedded memory arrays into a particular AND gate, e.g. 44, is an 0-bit, the particular AND gates, e.g. 44, generates/selects a 0-bit. Therefore, the AND gates also output their portions of the embedded memory arrays' outputs unaltered. Thus, the OR gates and the AND gates together always generate/select the embedded memory arrays' outputs unaltered during the normal mode of operation (TE=0).

During the test mode of operation (TE=1), the other input line, e.g. 43, of an OR gate, e.g. 42, receives a 1-bit as input, therefore, an OR gate, e.g. 42, always generates/selects a 1-bit regardless of the outputs of the embedded memory arrays. On the other hand, the other input line, e.g. 43, of an AND gate, e.g. 44, receives a 0-bit as input, therefore, an AND gate, e.g. 44, always generates/selects a 0-bit regardless of the output of the embedded memory arrays. Thus, the OR gates and the AND gates together always generate/select a predetermined constant during the test mode of operation (TE=1).

Figure 6:
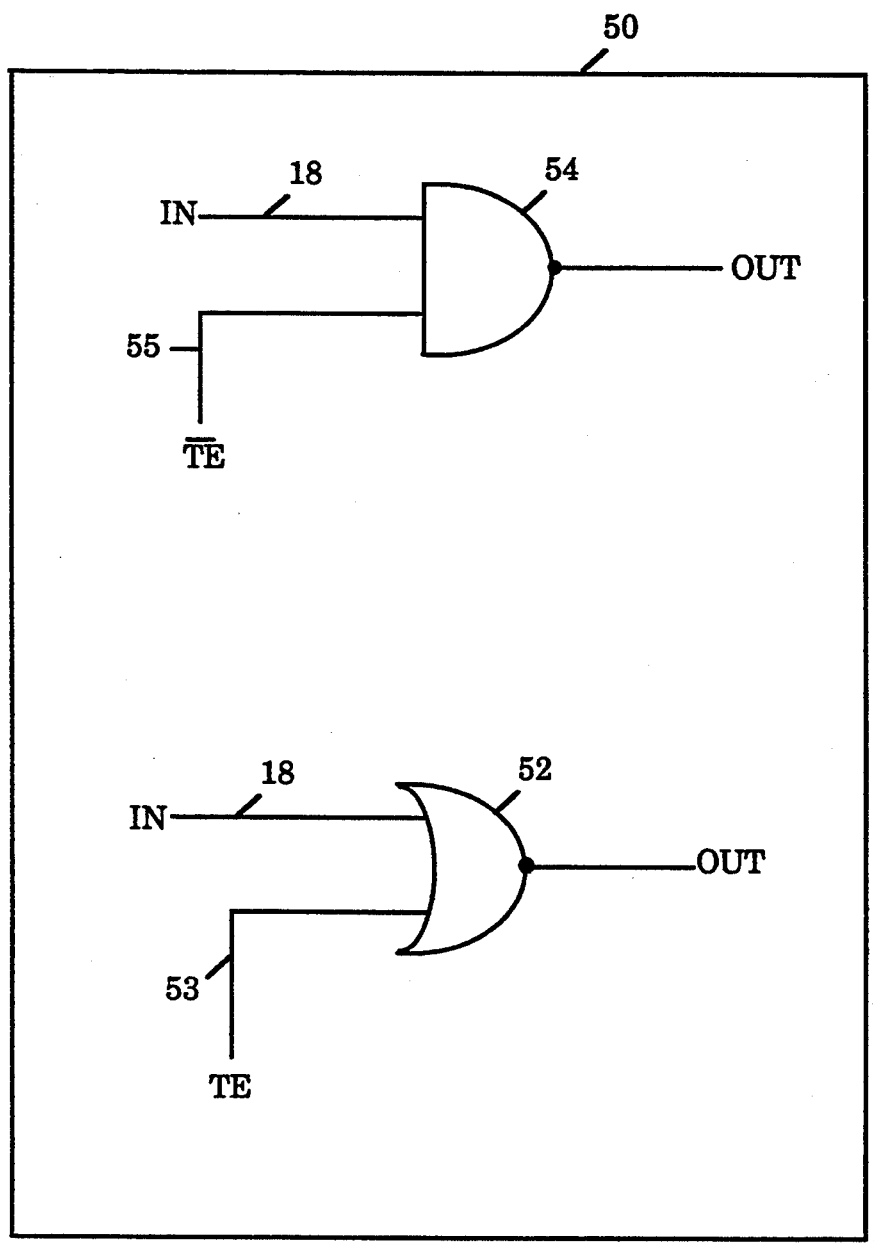
FIG. 6 is a block diagram illustrating the method and apparatus of the present invention where the embedded memory arrays are modified to achieve the desired controllability using an inverted gate-based constant generation/selection circuit.

Referring now to FIG. 6, alternatively, the embedded memory arrays may be modified such that their outputs are unaltered during the normal operation (TE=0) and altered to a predetermined constant during the test operation (TE=1) using an inverted gate-based constant generation/selection circuit 50. The inverted gate-based constant generation/selection circuit 50 produces the complement of the desirable input to the system logic. Therefore, the output of the inverted gate-based constant generation/selection circuit 50 is inverted before being provided to the system logic. The inverted gate-based constant generation/selection circuit 50 comprises a plurality of NOR gates (one shown, 52), and a plurality of NAND gates (one shown, 54). For an embedded memory arrays that output n bits, a total sum of n NOR gates and NAND gates are required for the inverted gate-based constant generation/selection circuit 50.

Each of the output lines of the embedded memory arrays is coupled to either one of the NOR gates, e.g. 52, or one of the NAND gates, e.g. 54, depending upon the bit to be output during the test mode of operation. An output line from the embedded memory arrays is coupled to a NOR gate, e.g. 52, if a 0-bit is to be generated in its replacement during the test mode of operation (TE=1). An output line from the embedded memory array is coupled to a NAND gate, e.g. 54, if a 1-bit is to be generated in its replacement during the test mode of operation (TE=1).

During the normal mode of operation (TE=0), the other input line, e.g. 53, of a NOR gate, e.g. 52, receives a 0-bit as input. If the output from the embedded memory arrays into the particular NOR gate, e.g. 52, is a 1-bit, the particular NOR gate, e.g. 52, generates/selects a 0-bit. If the output from the embedded memory arrays into the particular NOR gate, e.g. 52, is a 0-bit, the particular NOR gate, e.g. 52, generates/selects a 1-bit. Therefore, the NOR gates generate/select the complement of their portions the embedded memory arrays outputs "unaltered". On the other hand, the other input line, e.g. 55, of the NAND gate, e.g. 54, receives a 1-bit as input. If the output from the embedded memory arrays into a particular NAND gate is a 1-bit, the particular NAND gate, e.g. 54, generates/selects a 0-bit. If the output from the embedded memory arrays into the particular NAND gate, e.g. 54, is a 0-bit, the particular NAND gate, e.g. 54, generates/selects a 1-bit. Therefore, the NAND gates also generate/select the complement of their portions of the embedded memory arrays outputs "unaltered". Thus, the NOR gates and the NAND gates together always generate/select the complement of the embedded memory arrays outputs "unaltered" during the normal mode of operation (TE=0).

During the test mode of operation (TE=1), the other input line, e.g. 53, of a NOR gate. e.g. 52, receives a 1-bit as input. Therefore, a NOR gate, e.g. 52, always generates/selects a 0-bit (complement of a 1-bit) regardless of the outputs of the embedded memory arrays. On the other hand, the other input line, e.g. 55, of a NAND gate, e.g. 54, receives a 0-bit as input. Therefore, a NAND gate, e.g. 54, always generates/selects a 1-bit (complement of a 0-bit) regardless of the outputs of the embedded memory arrays. Thus, the NOR gates and the NAND gates together always generate/select the complement of a predetermined constant during the test mode of operation (TE=1).

Figure 7:
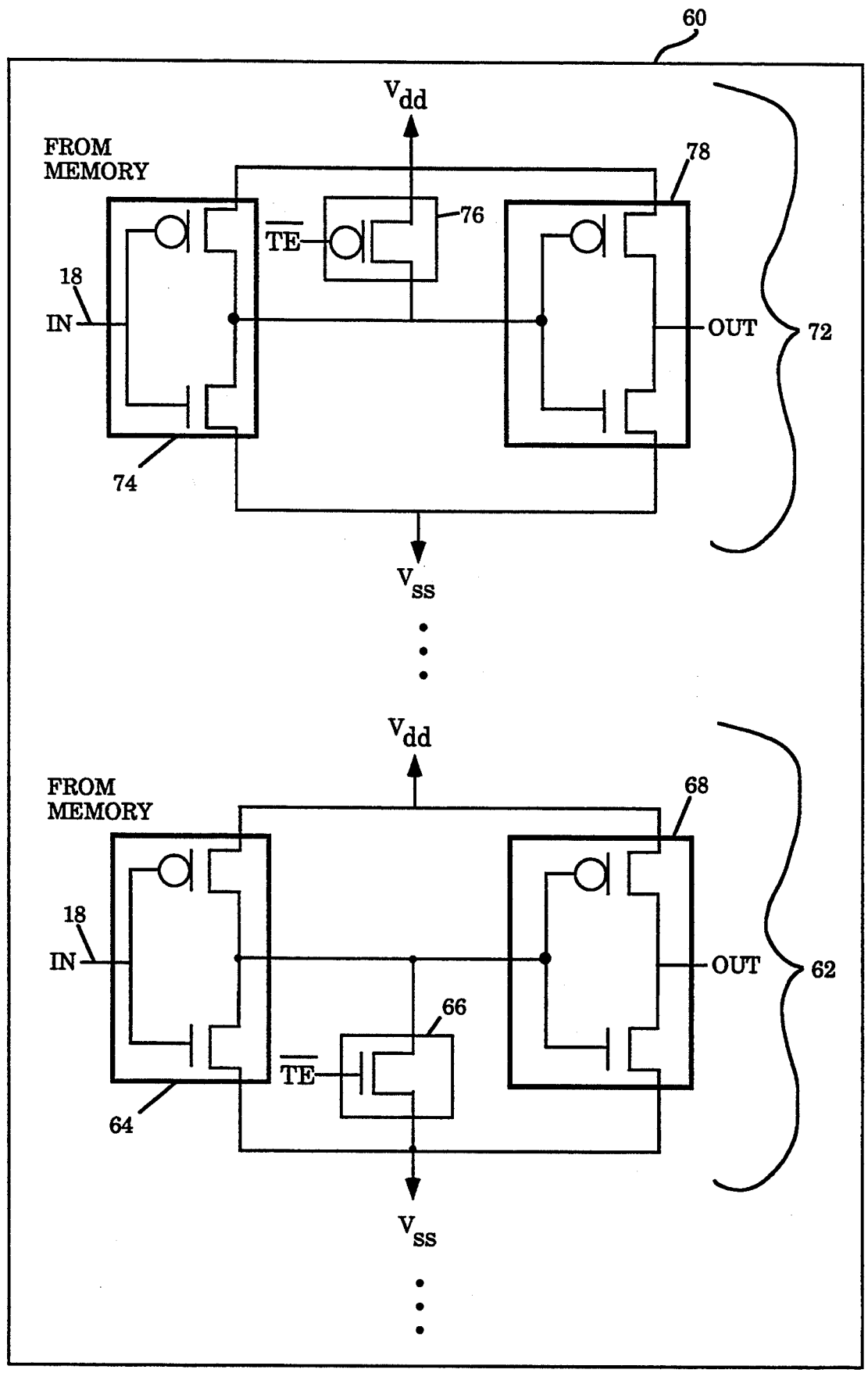
FIG. 7 shows a block diagram illustrating the method and apparatus of the present invention where the embedded memory arrays are modified to achieve the desired controllability using a transistor-based constant generation/selection circuit.

Referring now to FIG. 7, alternatively, the embedded memory arrays may be modified such that their outputs are unaltered during the normal operation (TE=0) and altered to a predetermined constant during the test operation (TE=1) using a transistor-based constant generation/selection circuit 60. The transistor-based constant generation/selection circuit 60 comprises a plurality of transistor based 1-bit generation/selection circuits (as shown, 62) and a plurality of 0-bit generation/selection circuit (one shown, 72). Each of the output lines of the embedded memory arrays is coupled to either one of the transistor based 1-bit generation/selection circuits, e.g. 62, or one of the transistor based 0-bit generation/selection circuit, e.g. 72, depending upon whether its output is to be altered to a 1-bit or a 0-bit during the test mode of operation. For embedded memory arrays that output n bits, a total of n 1-bit generation/selection circuit and 0-bit generation/selection circuits are required for the binary constant generation/selection circuit 60.

Each transistor-based 1-bit generation/selection circuit 62 comprises a first transistor-based inverter circuit 64 coupled to one of the output line of the embedded memory arrays, a second transistor-based inverter circuit 68 coupled to the output line of the first inverter circuit 64, and a transistor-based mode control circuit 66 coupled to the connection connecting the first and second inverter circuits 64, 68. The first transistor-based inverter circuit 64 comprises a first p-channel transistor and a first n-channel transistor serially connected to the first p-channel transistor. Both the first p-channel transistor and and the first n-channel transistor are coupled to the same output line of the embedded memory as their gate. Similarly, the second transistor-based inverter circuit 68 comprises a second p-channel transistor and a second n-channel transistor serially connected to the second p-channel transistor. Both the second p-channel transistor and the second n-channel transistor are coupled to the output line of the first inverter circuit 64 as their gate. The transistor-based mode control circuit 66 comprises a third n-channel transistor coupled to the connection connecting the first and second inverter circuits 64, 68 as its drain. The third n-channel transistor is capable of pulling more current than the first p-channel channel transistor of the first inverter circuit 64 and its gate is biased during the test mode of operation (TE=1).

During the normal mode of operation (TE=0), the third n-channel transistor is off. If the particular portion of output from the embedded memory arrays is 1, the first p-channel transistor is off and the first n-channel transistor is on, resulting in a 0-bit being output from the first inverter circuit 64 and input into the second inverter circuit 68. Therefore, the second p-channel transistor is on and the second n-channel transistor off, resulting in a 1-bit being generated/selected, which corresponds to the particular portion of the embedded memory arrays' output. If the particular portion of the output from the embedded memory arrays is 0, the first p-channel transistor is on and the first n-channel transistor is off, resulting in a 1-bit being output from the first inverter circuit 64 and input into the second inverter circuit 68. Therefore, the second p-channel transistor is off and the second n-channel transistor is on, resulting in a 0-bit being generated/selected, which corresponds to the particular portion of the embedded memory arrays' output. Thus, the transistor-based 1-bit constant generation/selection circuits 62 always generate/select their portions of the embedded memory arrays' outputs unaltered during the normal mode of operation (TE=0).

During the test mode of operation (TE=1), the third n-channel transistor is on. If the particular portion of output from the embedded memory arrays is 1, the first p-channel transistor is off and the first n-channel transistor is on, resulting in a 0-bit being output from the first inverter circuit 64 and input into the second inverter circuit 68. Therefore, the second p-channel transistor is on and the second n-channel transistor off, resulting in a 1-bit being generated/selected. If the particular portion of the output from the embedded memory arrays is 0, the first p-channel transistor is on and the first n-channel transistor is off, resulting in a 1-bit being output from the first inverter circuit 62. However, since the third n-channel transistor is on and pulls more current than the first p-channel transistor, the second inverter circuit 68 still receives a 0 as input. Therefore, the second p-channel is on and the second n-channel is off, resulting in a 1-bit being generated/selected. Thus, the transistor based 1-bit constant generation/selection circuits 62 always generate/select 1-bits for their portions of the embedded memory arrays' outputs during the test mode of operation (TE=1).

Each transistor-based 0-bit generation/selection circuit 72 comprises a first transistor-based inverter circuit 74 coupled to one of the output lines of the embedded memory arrays, a second transistor-based inverter circuit 78 coupled to the output line of the first inverter circuit 74, and a transistor-based mode control circuit 76 coupled to the connection connecting the first and second inverter circuits 74, 78. The first transistor-based inverter circuit 74 comprises a first p-channel transistor and a first n-channel transistor serially connected to the first p-channel transistor. Both the first p-channel transistor and the first n-channel transistor are connected to the same output line of the embedded memory arrays as their gate. Similarly, the second transistor-based inverter circuit 78 comprises a second p-channel transistor and a second n-channel transistor serially connected to the second p-channel transistor. Both the second p-channel transistor and the second n-channel transistor are connected to the output line of the first inverter circuit 74 as their gate. The transistor-based mode control circuit 76 comprises a third p-channel transistor coupled to the connection connecting the first and second inverter circuits 74, 78 as its source. The third p-channel transistor is capable of pulling more current than the first n-channel transistor of the first inverter circuit 64 and its gate is biased during the test mode of operation (TE=1).

During the normal mode of operation (TE=0), the third p-channel transistor is off. If the particular portion of output from the embedded memory arrays is 1, the first p-channel transistor is off and the first n-channel transistor is on, resulting in a 0-bit being output from the first inverter circuit 74 and input into the second inverter circuit 78. Therefore, the second p-channel transistor is on and the second n-channel transistor is off, resulting in a 1-bit being generated/selected, which corresponds to the particular portion of the embedded memory arrays' output. If the particular portion of the output from the embedded memory arrays is 0, the first p-channel transistor is on and the first n-channel transistor is off, resulting in a 1-bit being output from the first inverter circuit 74 and input into the second inverter circuit 78. Therefore, the second p-channel transistor is off and the second n-channel transistor is on, resulting in 0-bit being generated/selected, which corresponds to the particular portion of the embedded memory arrays' output. Thus, the transistor-based 0-bit constant generation/selection circuits always generate/select their portions of the embedded memory arrays' outputs unaltered during the normal mode of operation (TE=0).

During the test mode of operation (TE=1), the third p-channel transistor is on. If the output from the embedded memory arrays is 1, the first p-channel transistor is off and the first n-channel transistor is on, resulting in a 0-bit being output from the first inverter circuit 74. However, since the third p-channel transistor is on and pulls more current than the first n-channel transistor, the second inverter circuit 78 still receives a 1 as input. Therefore, the second p-channel transistor is off and the second n-channel transistor is on, resulting in a 0-bit being generated/selected. If the output from the embedded memory arrays is 0, the first p-channel transistor is on and the first n-channel transistor is off, resulting in a 1-bit being output from the first inverter circuit and input into the second inverter circuit 78. Therefore, the second p-channel transistor is off and the second n-channel transistor is on, resulting in a 0-bit being generated/selected. Thus, the transistor-based 0-bit constant generation/selection circuits 72 always generate/select 0-bits for their portions of the embedded memory arrays' outputs during the test mode of operation (TE=1).

Figure 8A:
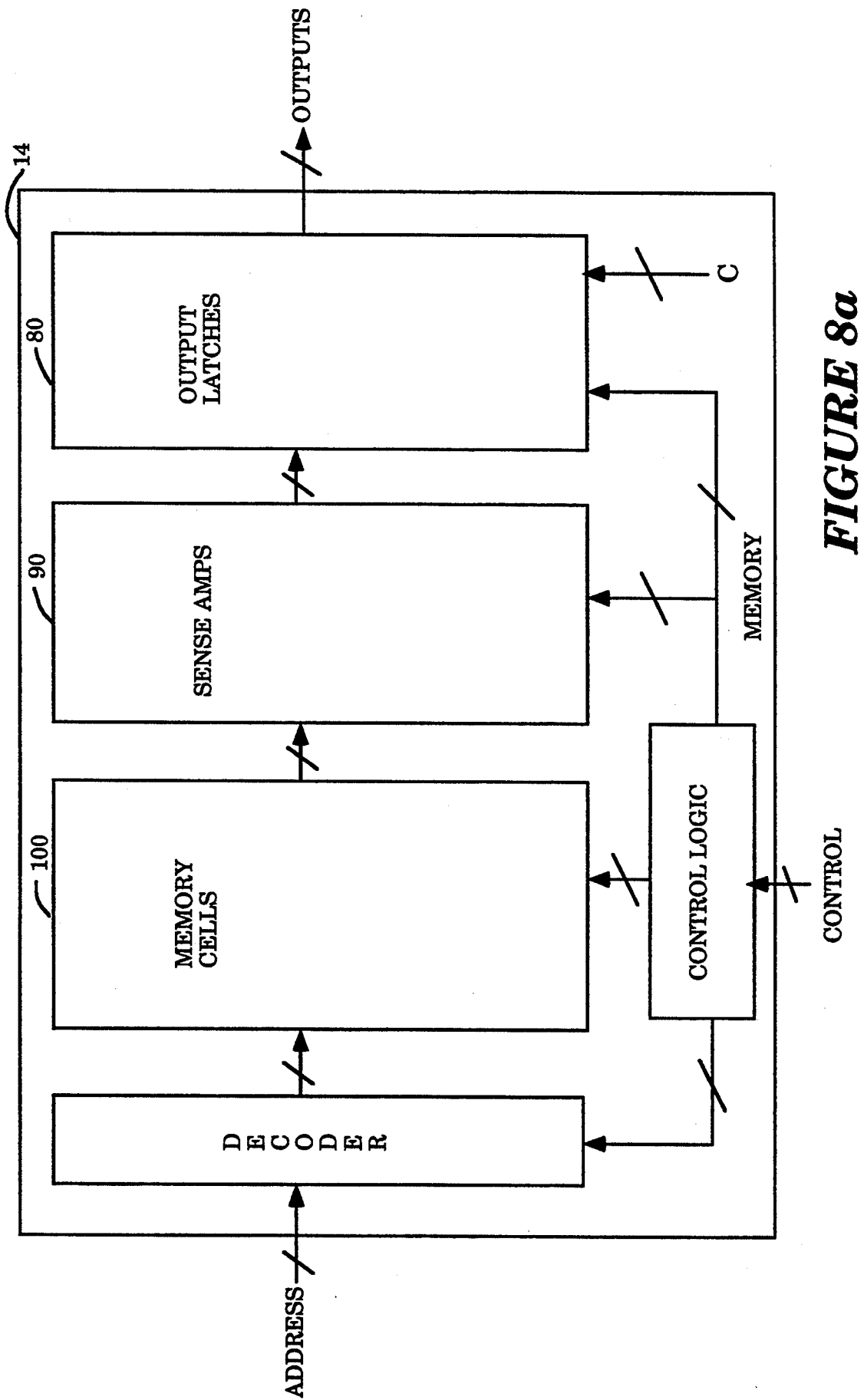
FIGS. 8a & 8b are block diagrams illustrating the method and apparatus of the present invention where the output latches of the embedded memory are modified to achieve the desired controllability.
Figure 8B:
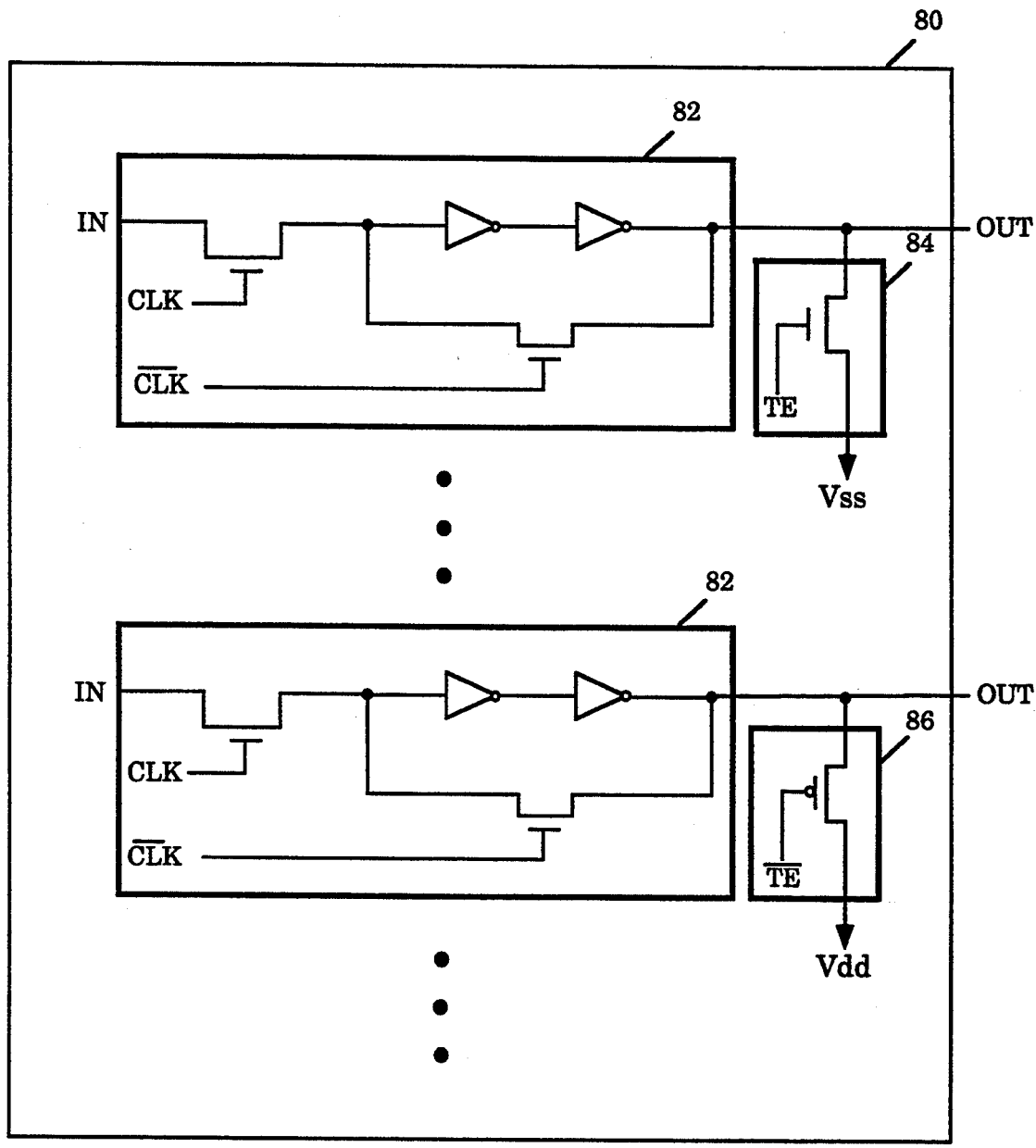

Referring now to FIG. 8a & 8b, alternatively, the output latches 80 of the embedded memory arrays 14 may be modified such that their outputs are unaltered during the normal mode of operation (TE=0) and altered to a predetermined constant during the test mode of operation (TE=1). Memory array 14 also includes sense amplifiers 90, memory cells 200, a decoder 202 and control logic 204, interconnected as shown. Each of the output latches 82 (FIG. 8b) is either modified with a p-channel transistor 86 or a n-channel transistor 84 depending on whether the particular output latch is to generate/select a 1-bit or 0-bit during the test mode of operation (TE=1). For embedded memory arrays 14 with n output latches, a total of n p-channel transistors 86 and n-channel transistors 84 are required.

A p-channel transistor 86 is connected to the output line of a particular latch as its source and a gate which is biased during the test mode of operation (TE=1). A n-channel transistor 84 is connected to the output line of a particular latch as it drain and a gate which is biased during the test mode of operation (TE=1).

During the normal mode of operation (TE=0), neither the p-channel transistors 86 nor the n-channel transistors 84 are on, therefore, the output of the latches 82 are generated/selected unaltered. During the test mode of operation (TE=1), both the p-channel transistors 86 and the n-channel transistors 84 are on, therefore 1-bits and 0-bits are generated/selected respectively, regardless of the outputs of the output latches 82. Thus, together the modified output latches 82 always generate/select the embedded memory arrays' output unaltered during the normal mode of operation (TE=0) and a predetermined constant during the test mode of operation (TE=1).

Figure 9A:
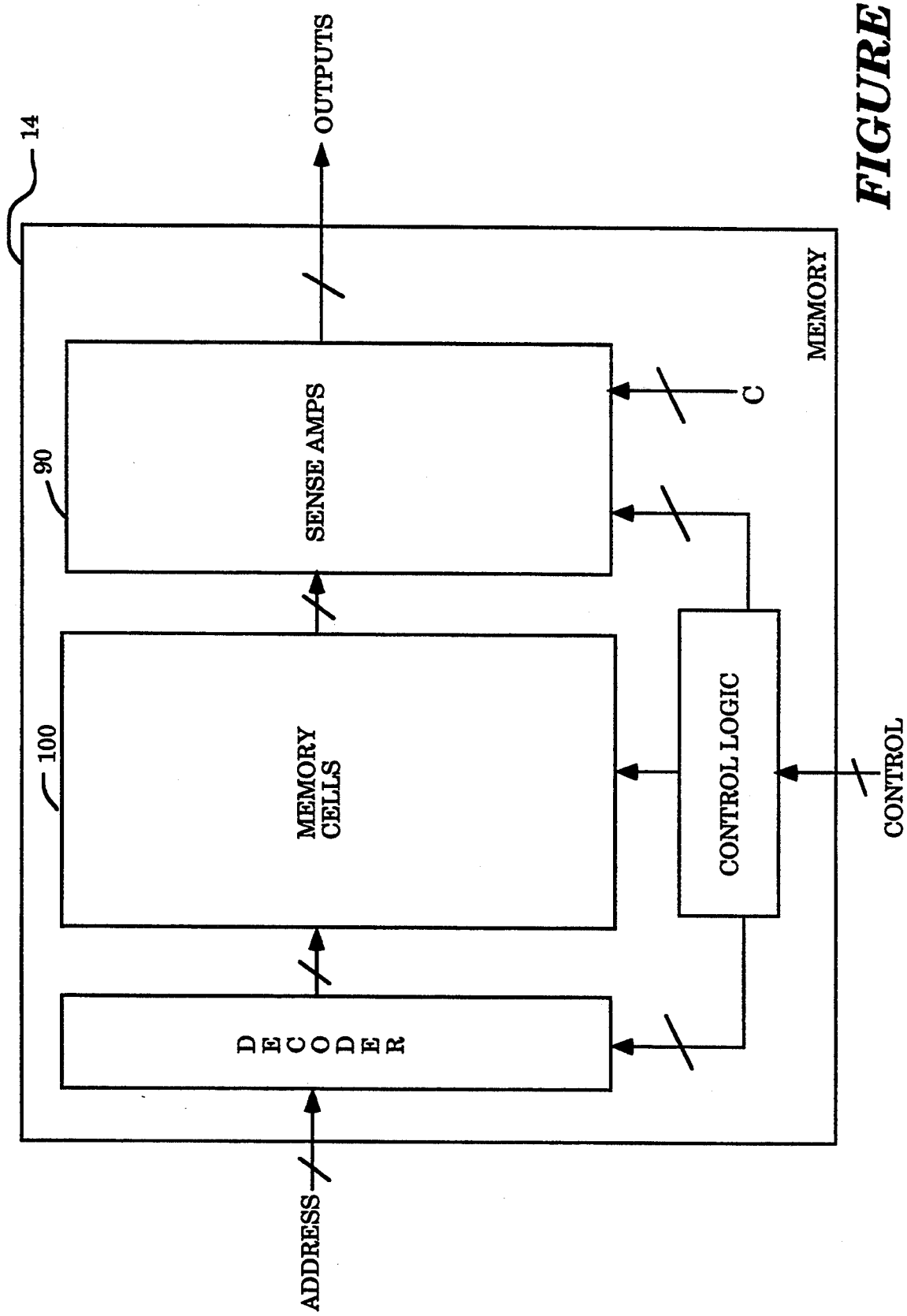
FIGS. 9a-9c are block diagrams illustrating the method and apparatus of the present invention where the sense amplifiers of the embedded memory are modified to achieve the desired controllability.
Figure 9B:
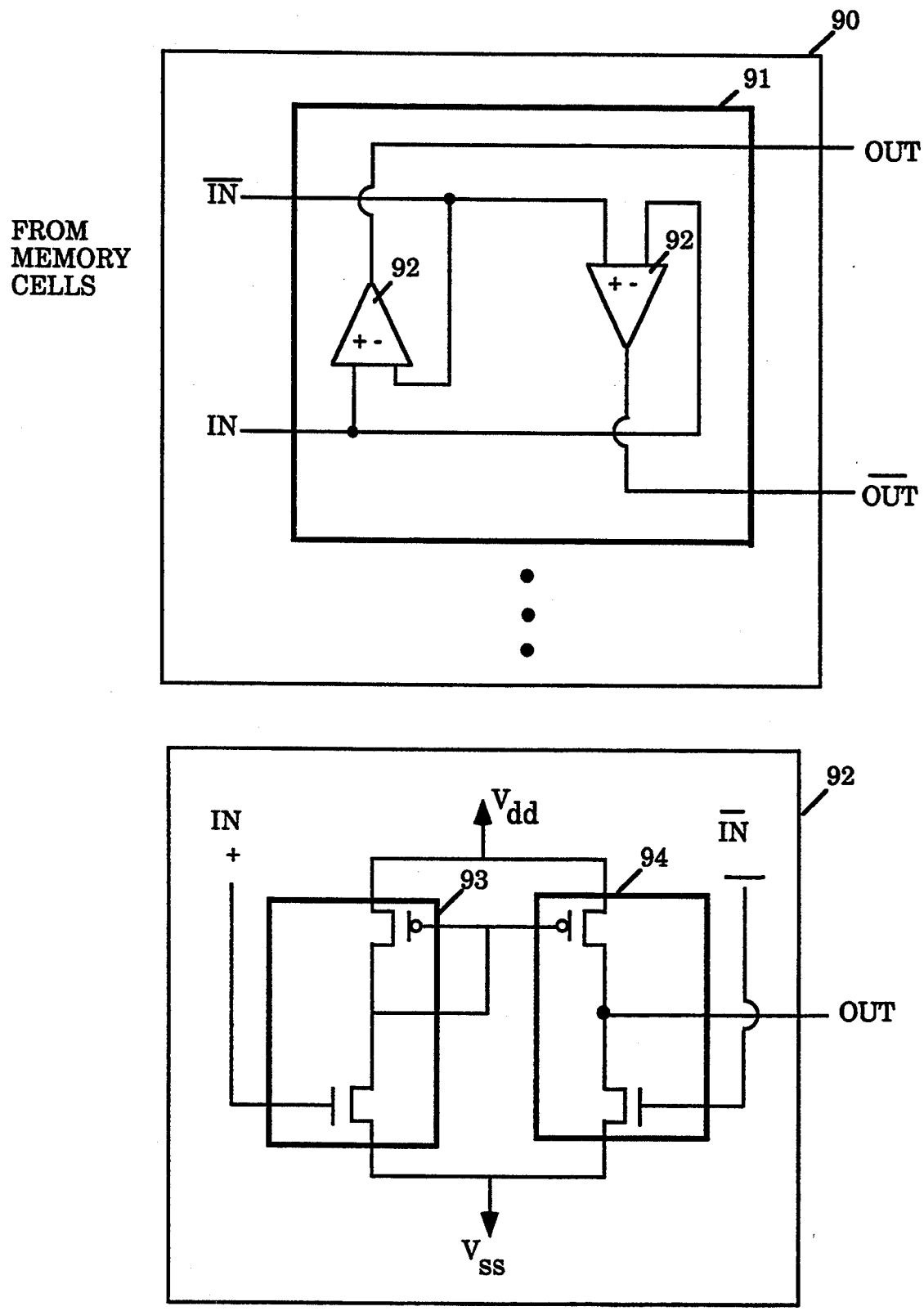
Figure 9C:
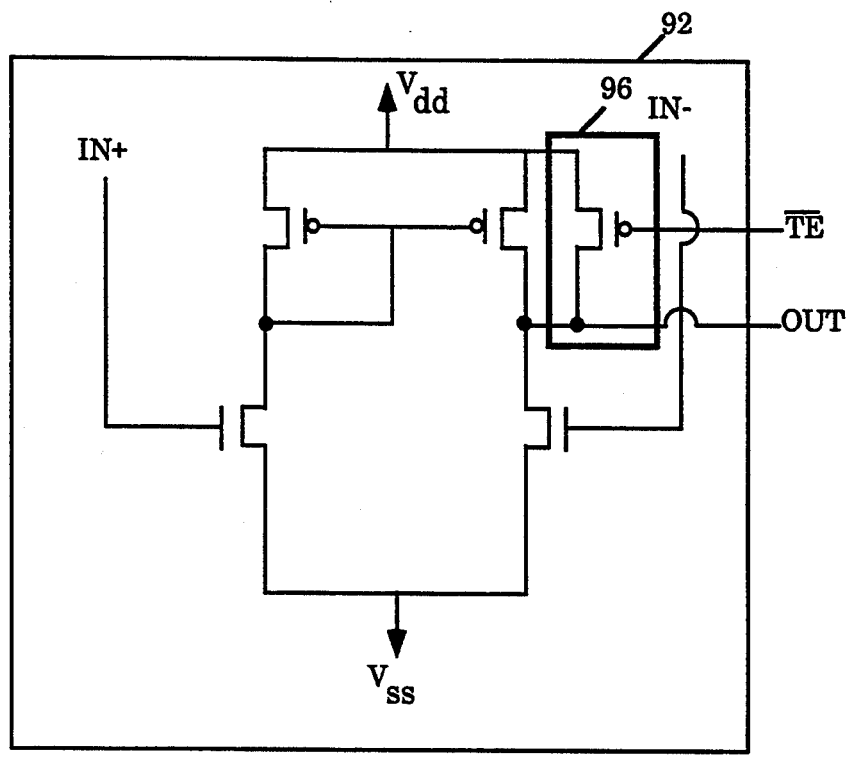
Figure 9C:
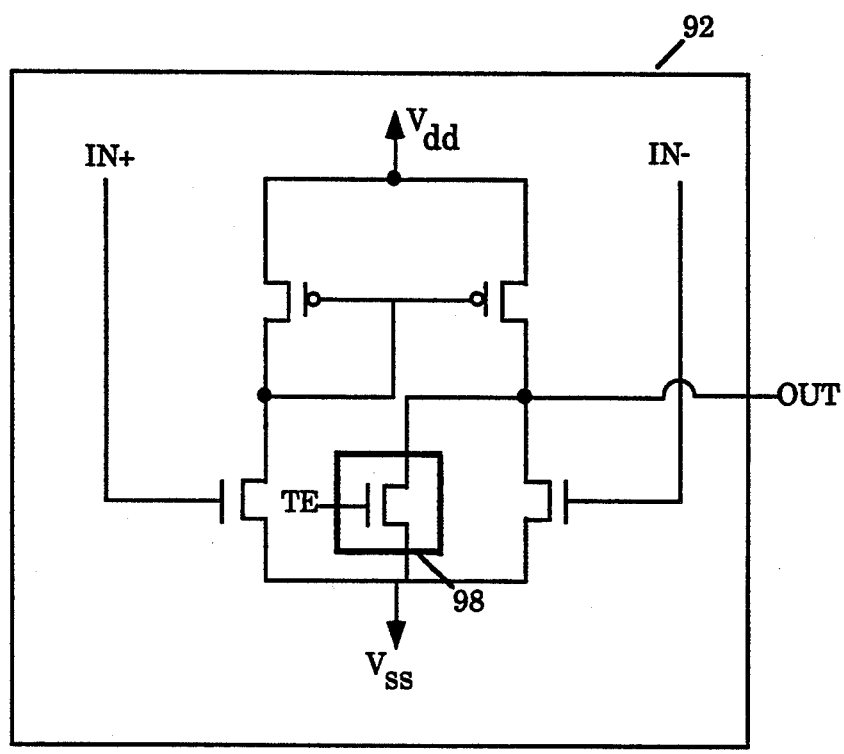

Referring now to FIG. 9a–9c, alternatively, the sense amplifiers 90 of the embedded memory arrays 14 may be modified such that their outputs are unaltered during the normal mode of operation (TE=0) and altered to a predetermined constant during the test mode of operation (TE=1). Memory arrays 14 also includes memory cells 200, a decoder 202 and control logic 204 connected as shown. FIG. 9b shows a typical sense amplifier 91 receiving one of the outputs and one of the inverted outputs of the memory cells as inputs. A typical sense amplifier 91 comprises first and second differential amplifiers 92 for amplifying one of the output lines and one of the the inverted output lines of the memory cells respectively.

FIG. 9b also shows a typical differential amplifier 92 for amplifying an output line of the memory cells. The differential amplifier 92 comprising a first and second transistor pairs 93, 94. The first transistor pair 93 comprises a first p-channel transistor and a first n-channel transistor serially connected to the first p-channel transistor. Similarly, the second transistor pair 94 comprises a second p-channel transistor and a second n-channel transistor serially connected to the second p-channel transistor. The first n-channel transistor is connected to one of the output lines of the memory cells as its gate and the second n-channel transistor is connected to one of the inverted output lines of the memory cells as its gate. Both the first and second p-channel transistors are connected to a common gate which also serves as a drain for the first n-channel transistor. The output is taken from the connection serially connecting the second p-channel transistor and the second n-channel transistor.

FIG. 9c shows that a typical differential amplifier may be modified either by adding a third p-channel transistor 96 or a third n-channel transistor 98 depending whether the particular differential amplifier is to generate/select a 1 bit or a 0-bit during the test mode of operation (TE=1). The third p-channel transistor 96 is connected in a manner such that it parallels the second p-channel transistor and serially connects to the second n-channel transistor. The third n-channel transistor 98 is connected in such a manner that it parallels the second n-channel transistor and serially connects to the second p-channel transistor. The gates of both the third p-channel transistor 96 and the third n-channel transistor 98 are biased during the test mode of operation (TE=1).

During the normal mode of operation (TE=0), both the third p-channel transistor 96 and the third n-channel transistor 98 are off. If the particular output line of the memory cells is 1, the first n-channel transistor is on, resulting in the common gate of both the first and second p-channel transistors to be 0 and causing them to be on. Since the particular inverted output line of the memory cells is 0 (the output line being 1), the second n-channel transistor is off, therefore, the differential amplifier 92 generates/selects a 1-bit, which corresponds to the particular output line of the memory cells. If the particular output line of the memory cells is 0, the first n-channel transistor is off, resulting in the common gate of both the first and second p-channel transistors to be 0 and causing them to be on. Since the particular inverted output line of the memory cell is 1 (the output line being 0), the second n-channel transistor is on, therefore, the differential amplifier 92 generates/selects a 0-bit, which corresponds to the particular output of the memory cells. Thus, the sense amplifiers 92 generate/selects the memory cells' outputs unaltered during the normal mode of operation (TE=0).

During the test mode of operation (TE=1), the third p-channel transistor 96 is on. Thus, the sense amplifiers 92 modified with third p-channel transistors 96 always generate/select 1-bits, during the test mode of operation (TE=1). Similarly, the third n-channel transistor 98 is on. Thus, the sense amplifiers 92 modified with third n-channel transistors always generate/select 0-bits, during the test mode of operation (TE=1).

Figure 10A:
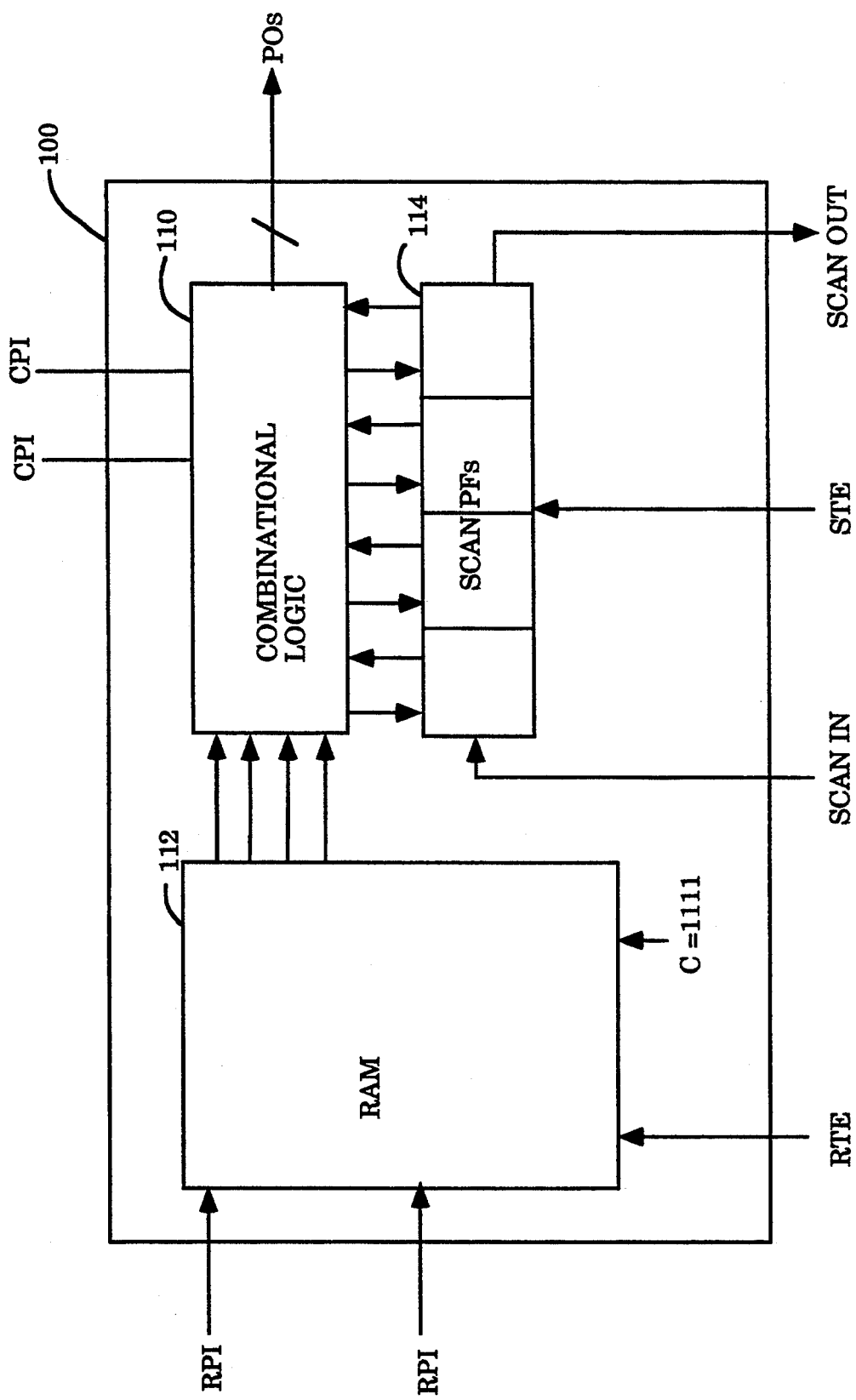
FIGS. 10a shows a block diagram illustrating application of the method and apparatus of the present invention to an exemplary integrated circuit with embedded memory arrays.
Figure 10B:
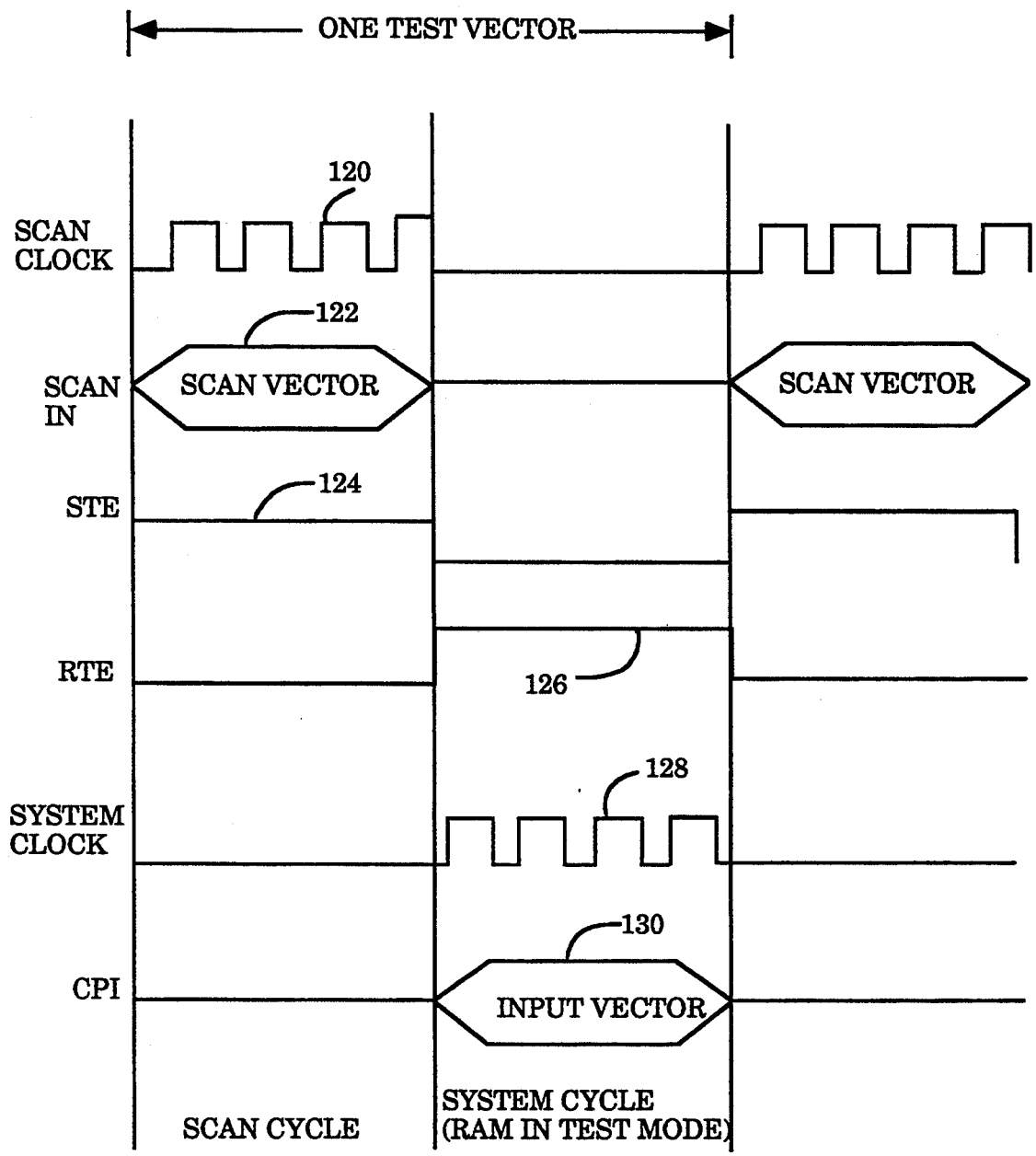
FIG. 10b shows the associated timing diagram for testing the system logic of the exemplary integrated circuit.

Referring now to FIGS. 10a & 10b, a block diagram illustrating an exemplary integrated circuit with modified embedded memory arrays and an associated timing diagram for testing system logic are shown. The exemplary integrated circuit 100 (FIG. 10a) comprises combinational logic 110 and embedded random access memory 112. The combinational logic 110 has incorporated scan-based design flip-flops 114 for testability. The embedded random access memory 112 has been modified applying the method of the present invention such that its outputs are unaltered during the normal mode of operation (TE=0) and altered to a predetermined constant "1111" during the test mode of operation (TE=1).

For each test vector (FIG. 10b), the test mode of operation (STE) 124 is set high for the scan flip-flops, and a scan vector 122 is scanned into the combinational logic's scan chain, during the scan clock cycles 120. During the subsequent system clock cycles 128, the test mode of operation (RTE) is set high 126 for the modified random access memory resulting in the predetermined constant "1111" being output from the embedded memory into the combinational logic. At the same time, an input vector (CPI) 130 is provided to the combinational logic and the output of the combinational logic is checked. Additionally, the scan values in the scan chain may be shifted out for comparison. It will be appreciated that the scan values in the scan chain may be shifted out concurrent with scanning in another scan vector during the next series of scan clock cycles.

The method of the present invention was applied to testing the system logic of the C880 circuit from the International Symposium on Circuit and System (IS-CAS) test generation benchmarks. The system logic of the C880 circuit comprises 60 inputs and 26 outputs. Of the 60 inputs into the system logic, 8 are considered to be outputs from the embedded memory arrays into the system logic. For further description of the C880 circuit, see *Proceedings of the International Symposium on Circuits and System Conference*, 1985.

The fault coverages of the system logic of the C880 circuit were measured under three scenarios:

a. all outputs from the embedded memory arrays into the system logic are made fully controllable and observable;

b. all outputs from the embedded memory arrays into the system logic are handled as unknown values (X);

c. all outputs from the embedded memory arrays into the system logic are altered to the predetermined constant "11111111".

The first scenario establishes the upper bound for fault coverage of the system logic under full controllability and observability of the embedded memory arrays. The second scenario establishes the lower bound for fault coverage of the system logic under zero controllability and zero observability of the embedded memory arrays. The third scenario establishes the fault coverage effectiveness of the method of the present invention relative to these upper and lower bounds.

The fault coverages of the system logic of the C880 circuit measured under the three different scenarios were:

| Scenario | No. of Test Vector Used | Fault Coverage Measured |
|---|---|---|
| a. Full Ctrl/Obs | 81 | 100% |
| b. Unknown Val | 55 | 63% |
| c. Constant | 69 | 95% |

The fault coverage measurements show that when the embedded memory arrays are controlled to the predetermined constant using the method of the present invention, the fault coverage of the system logic of the C880 circuit is substantially increased from the lower bound (from 63% to 95%). The fault coverage of the system logic of the C880 circuit is only a few percentage points less than the upper bound (95% vs 100%). The significant increase in fault coverage of the system logic of the C880 circuit was achieved without incurring substantial increase in hardware and performance penalties.

While the invention has been described in terms of various preferred modification approaches, those skilled in the art will recognize that the invention is not limited to the modification approaches described. The method of the present invention can be practiced with modification and alteration within the spirit and scope of the appended claims.

What is claimed is:

1. An apparatus comprising:
    a memory array storing and outputting operational data;
    a binary constant generator/selector, coupled to said memory array and to a test enable input line, said binary constant generator/selector receiving said operational data and a test enable signal and providing as output signals said operational data if said test enable signal is in a first state indicating a normal mode of operation and a binary constant if said test enable signal is in a second state indicating a test mode of operation; and
    system logic circuitry, coupled to said binary constant generator/selector, said system logic circuitry processing said output signals of said binary constant generator/selector wherein said binary constant is permanently set to a fixed value.

2. The apparatus of claim 1, wherein said binary constant generator/selector comprises:
    a plurality of multiplexers, each coupled to one of a plurality of output lines of said memory array and to a binary constant signal source, said plurality of multiplexors outputting operational data provided along said output lines of said memory array during said normal mode of operation, and said binary constant during said test mode of operation.

3. The apparatus of claim 1, wherein said binary constant generator/selector comprises:
    a first plurality of multiplexors, each coupled to one of a first plurality of output lines of said memory array and to a 1-bit signal source, said first plurality of multiplexors outputting a first portion of said operational data during said normal mode of operation, and said 1-bit signals during said test mode of operation; and
    a second plurality of multiplexors, each coupled to one of a second plurality of output lines of said memory array and to a 0-bit source for outputting a second portion of said operational data during said normal mode of operation, and 0-bit signals during said test mode of operation.

4. The apparatus of claim 1, wherein said binary constant generator/selector comprises:
    a first mode controller outputting a 0-bit during said normal mode of operation and a 1-bit during said test mode of operation;
    a plurality of OR gates each coupled to said first mode controller and to one of a first plurality of output lines of said memory array, said first plurality of OR gates collectively outputting a first portion of said operational data during said normal mode of operation and outputting 1-bits during said test mode of operation; and
    a second mode controller outputting a 1-bit during said normal mode of operation and a 0-bit during said test mode of operation; and
    a plurality of AND gates each coupled to said second controller and to one of a second plurality of output lines of said memory array, said plurality of AND gates collectively outputting a second portion of said operational during said normal mode of operation and 0-bits during said test mode of operation.

5. The apparatus of claim 1, wherein said binary constant generator/selector comprises:
    a first mode controller outputting a 1-bit during said normal mode of operation and a 0-bit during said test mode of operation;

a plurality of NAND gates each coupled to said first mode controller and to one of a first plurality of output lines of said memory array, said plurality of NAND gates collectively outputting the complement of a first portion of said operational data during said normal mode of operation and the complement of 0-bits during said test mode of operation;

a second mode controller outputting a 0-bit during said normal mode of operation and a 1-bit during said test mode of operation; and a plurality of NOR gates each coupled to said second mode controller and to one of a second plurality of output lines of said memory array, said plurality of NOR gates collectively outputting the complement of a second portion of said operational data during said normal mode of operation and the complement of 1-bits during said test mode of operation.

6. The integrated circuit of claim 1, wherein said memory array, said binary constant generator/selector and said system logic circuitry are all formed within a single integrated circuit.

7. The apparatus of claim 1, wherein said binary constant generator/selector comprises a set of output latches, coupled to said memory array, said latches outputting said operational data during said normal mode of operation and said predetermined binary constant during said test mode of operation.

8. The apparatus of claim 7, wherein said set of output latches comprises:

a first and a second plurality of output latch elements, each coupled to one of a first and second plurality of output lines of said memory array, said first and second plurality of output latch elements collectively outputting respective first and second portions of said operational data;

a plurality of n-channel transistors each having a drain coupled to an output of a respective one of said first plurality of latch elements, a gate connected to said test enable input line, and a source connected to a low voltage source; and a plurality of p-channel transistors each having a source coupled to an output of a respective one of said second plurality of latch elements, a gate connected to said test enable input line, and a drain connected to a high voltage source.

9. The apparatus of claim 1, wherein said binary constant generator/selector comprises:

a plurality of transistor-based 1-bit generator elements each coupled to one of a first plurality of output lines of said memory array, said 1-bit generator elements collectively outputting a first portion of said operation data during said normal mode of operation and 1-bits during said test mode of operation; and a plurality of transistor-based 0-bit generator elements each coupled to one of a second plurality of output lines of said memory array, said 0-bit generator elements collectively outputting a second portion of said operational data during said normal mode of operation and 0-bits during said test mode of operation.

10. The apparatus of claim 9, wherein each of said transistor based 1-bit generator elements comprises:

a first p-channel transistor having a source, a gate and a drain;

a first n-channel transistor having a drain connected to said drain of said p-channel transistor, a gate and a source connected to a low voltage source, with said gates of said first p-channel transistor and said first n-channel transistor both connected to a respective one of said first plurality of output lines of said memory array;

a second p-channel transistor having a source, a gate and a drain;

a second n-channel transistor having a drain connected to said source of said first p-channel transistor, a gate and a drain connected to said low voltage source, with said gates of said second p-channel transistor and said second n-channel transistor both connected to said drain of said first p-channel transistor; and a third p-channel transistor having a source connected to a high voltage, a gate connected to said test enable input line, and a drain connected to said drain of said first p-channel transistor.

11. The apparatus of claim 9, wherein said transistor-based 0-bit generator elements each comprises:

a first p-channel transistor having a source, a gate and a drain;

a first n-channel transistor having a drain connected to said drain of said p-channel transistor, a gate, and a source connected to a low voltage source, with said gates of said first p-channel transistor and said first n-channel transistor both connected to a respective one of said second plurality of output lines of said memory array;

a second p-channel transistor having a source, a gate and a drain;

a second n-channel transistor having a drain connected to said source of said first p-channel transistor, a gate, and a source connected to said low voltage source, with said gates of said second p-channel transistor and said second n-channel transistor both connected to said drain of said first p-channel transistor; and a third p-channel transistor having a source connected to said drain of said first p-channel transistor, a gate connected to said test enable input line, and a drain connected to said drain of said first n-channel transistor and to said low voltage source.

12. The apparatus of claim 1, wherein said memory array includes memory cells and wherein said binary constant generator/selector comprises:

a first plurality of differential amplifiers each coupled to one of a first plurality of output lines of said memory cells, said first plurality of differential amplifiers collectively outputting a first portion of operational data from said memory cells during said normal mode of operation and 1-bits during said test mode of operation; and a second plurality of differential amplifiers each coupled to one of a second plurality of output lines of said memory cells, said second plurality of differential amplifiers collectively outputting a second portion of said operational data during said normal mode of operation and 0-bits during said test mode of operation.

13. The apparatus in claim 12, each of said first plurality of differential amplifiers comprises:

a first n-channel transistor having a drain, a gate connected to an output of a respective one of said memory cells, and a source connected to a low voltage source;

a first p-channel transistor having a source connected to a high voltage source, a gate, a drain connected to said drain of said first n-channel transistor;

a second p-channel transistor having a source connected to said high voltage, a gate connected to said gate of said first p-channel transistor and to said drain of said first n-channel transistor and a drain connected to an output line;

a second n-channel transistor having a drain connected to said drain of said second p-channel transistor and to said output line, a gate connected to an inverted input from said respective memory cell, a source connected to said low voltage;

a third p-channel transistor having a source connected to said high voltage, a gate connected to said test enable input, and a drain connected to said output line.

14. The apparatus of claim 13, wherein each of said second plurality of differential amplifiers comprises:

a first n-channel transistor having a drain, a gate connected to an output of a respective one of said memory cells, and a source connected to a low voltage source;

a first p-channel transistor having a drain connected to a high voltage source, a gate, a drain connected to said source of said first n-channel transistor;

a second p-channel transistor having a source connected to said high voltage, a gate connected to said gate of said first p-channel transistor and to said drain of said first n-channel transistor and a drain connected to an output line;

a second n-channel transistor having a drain connected to said drain of said second p-channel transistor and to said output line, a gate connected to an inverted input from said respective memory cell, a source connected to said low voltage;

a third n-channel transistor having a drain connected to said output line, a gate connected to said test enable input, and a source connected to said low voltage.

15. An integrated circuit comprising:

an embedded memory array storing and outputting operational data;

a first plurality of multiplexors, each coupled to one of a first plurality of output lines of said memory array, to a 1-bit signal source and to a test enable input, said first plurality of multiplexors outputting a first portion of said operational data during a normal mode of operation identified by said test enable input being in a first state, and outputting said 1-bit signals during a test mode of operation identified by said test enable signal being in a second state;

a second plurality of multiplexors, each coupled to one of a second plurality of output lines of said memory array, to a 0-bit source and to said test enable input for outputting a second portion of said operational data during said normal mode of operation, and 0-bit signals during said test mode of operation; and system logic circuitry, coupled to said first and second plurality of multiplexors, for processing said operational data, said system logic circuitry receiving said 0-bit signals and set 1-bit signals during said test mode of operation in a permanent arrangement that represents a fixed value, and receiving said first and second portion of operational data during said normal mode of operation.

16. A method comprising the steps of:

providing a memory array for performing the steps of storing and outputting operational data;

providing a binary constant generator/selector, coupled to said memory array, for performing the step of receiving said operational data and a test enable signal and providing as output signals said operational data if said test enable signal is in a first state indicating a normal mode of operation and a binary constant if said test enable signal is in a second state indicating a test mode of operation; and providing system logic for processing said output signals of said binary constant generator/selector wherein said binary constant is permanently set to a fixed value.

17. The method of claim 16, wherein said step of providing a binary constant generator/selector comprises the steps of:

providing a plurality of multiplexors, each coupled to one of a plurality of output lines of said memory array and to a binary constant signal source, for performing the step of outputting operational data provided along said output lines of said memory array during said normal mode of operation, and outputting said binary constant during said test mode of operation.

18. The method of claim 16, wherein said step of providing a binary constant generator/selector comprises the steps of:

providing a first plurality of multiplexors, each coupled to one of a first plurality of output lines of said memory array and to a 1-bit signal source, for performing the step of outputting a first portion of said operational data during said normal mode of operation, and outputting said 1-bit signals during said test mode of operation; and providing a second plurality of multiplexors, each coupled to one of a second plurality of output lines of said memory array and to a 0-bit source for performing the step of outputting a second portion of said operational data during said normal mode of operation, and outputting 0-bit signals during said test mode of operation.

19. The method of claim 16, wherein said step of providing a binary constant generator/selector comprises the step of:

providing a first mode controller for performing the step of outputting a 0-bit during said normal mode of operation and a 1-bit during said test mode of operation;

providing a plurality of OR gates each coupled to said first mode controller and to one of a first plurality of output lines of said memory array, collectively for performing the step of outputting a first portion of said operational data during said normal mode of operation and outputting 1-bits during said test mode of operation;

providing a second mode controller for performing the step of outputting a 1-bit during said normal mode of operation and a 0-bit during said test mode of operation; and providing a plurality of AND gates each coupled to said second controller and to one of a second plurality of output lines of said memory array, for performing the step of collectively outputting a second portion of said operational during said normal mode of operation and 0-bits during said test mode of operation.

20. The method of claim 16, wherein said step of providing a binary constant generator/selector comprises the steps of:
  providing a first mode controller for performing the step of outputting a 1-bit during said normal mode of operation and a 0-bit during said test mode of operation;
  providing a plurality of NAND gates each coupled to said first mode controller and to one of a first plurality of output lines of said memory array, for performing the step of collectively outputting the complement of a first portion of said operational data during said normal mode of operation and the complement of 0-bits during said test mode of operation;
  providing a second mode controller for performing the step of outputting a 0-bit during said normal mode of operation and a 1-bit during said test mode of operation; and
  providing a plurality of NOR gates each coupled to said second mode controller and to one of a second plurality of output lines of said memory array, said plurality of NOR gates collectively outputting the complement of a second portion of said operational data during said normal mode of operation and the complement of 1-bits during said test mode of operation.

21. The method of claim 16, wherein said step of providing binary constant generator/selector comprises the steps of:
  providing a plurality of transistor-based 1-bit generator elements each coupled to one of a first plurality of output lines of said memory array, for performing the step of collectively outputting a first portion of said operational data during said normal mode of operation and 1-bits during said test mode of operation; and
  providing a plurality of transistor-based 0-bit generator elements each coupled to one of a second plurality of output lines of said memory array, for performing the step of collectively outputting a second portion of said operational data during said normal mode of operation and 0-bits during said test mode of operation.

22. The method of claim 21, wherein said step of providing said transistor based 1-bit generator elements comprises the steps of:
  providing a first p-channel transistor having a source, a gate and a drain;
  providing a first n-channel transistor having a drain connected to said drain of said p-channel transistor, a gate and a source connected to a low voltage source, with said gates of said first p-channel transistor and said first n-channel transistor both connected to a respective one of said first plurality of output lines of said memory array;
  providing a second p-channel transistor having a source, a gate and a drain;
  providing a second n-channel transistor having a drain connected to said source of said first p-channel transistor, a gate and a source connected to said low voltage source, with said gates of said second p-channel transistor and said second n-channel transistor both connected to said drain of said first p-channel transistor; and
  providing a third p-channel transistor having a source connected to a high voltage, a gate connected to said test enable input line, and a drain connected to said drain of said first p-channel transistor.

23. The method of claim 21, wherein said step of providing transistor-based 0-bit generator elements comprises the steps of:
  providing a first p-channel transistor having a source, a gate and a drain;
  providing a first n-channel transistor having a drain connected to said drain of said p-channel transistor, a gate, and a source connected to a low voltage source, with said gates of said first p-channel transistor and said first n-channel transistor both connected to a respective one of said second plurality of output lines of said memory array;
  providing a second p-channel transistor having a source, a gate and a drain;
  providing a second n-channel transistor having a drain connected to said source of said first p-channel transistor, a gate, and a source connected to said low voltage source, with said gates of said second p-channel transistor and said second n-channel transistor both connected to said drain of said first p-channel transistor; and
  providing a third p-channel transistor having a source connected to said drain of said first p-channel transistor, a gate connected to said test enable input line, and a drain connected to said source of said first n-channel transistor and to said low voltage source.

24. The method of claim 16, wherein the step of providing each of said second plurality of differential amplifiers comprises:
  providing a first n-channel transistor having a drain, a gate connected to an output of a respective one of said memory cells, and a source connected to a low voltage source;
  providing a first p-channel transistor having a source connected to a high voltage source, a gate, a drain connected to said drain of said first n-channel transistor;
  providing a second p-channel transistor having a source connected to said high voltage, a gate connected to said gate of said first p-channel transistor and to said drain of said first n-channel transistor and a drain connected to an output line;
  providing a second n-channel transistor having a drain connected to said drain of said second p-channel transistor and to said output line, a gate connected to an inverted input from said respective memory cell, and a source connected to said low voltage;
  providing a third n-channel transistor having a drain connected to said output line, a gate connected to said test enable input, and a source connected to said low voltage.

25. The method of claim 16, wherein said step of providing binary constant generator/selector comprises the steps of:
  providing a set of output latches, coupled to said memory array for performing the step of outputting said operational data during said normal mode of operation and said predetermined binary constant during said test mode of operation.

26. The method of claim 25, wherein said step of providing set of output latches comprises the steps of:
  providing a first and a second plurality of output latch elements, each coupled to one of a first and second plurality of output lines of said memory array, for performing the step of collectively outputting respective first and second portions of said operational data;

a plurality of n-channel transistors each having a drain coupled to an output of a respective one of said first plurality of latch elements, a gate connected to said test enable input line, and a source connected to a low voltage source; and a plurality of p-channel transistors each having a source coupled to an output of a respective one of said second plurality of latch elements, a gate connected to said test enable input line, and a drain connected to a high voltage source.

27. The method of claim 16, wherein said memory array includes memory cells and wherein said step of providing binary constant generator/selector comprises:

providing a first plurality of differential amplifiers each coupled to one of a first plurality of output lines of said memory cells, for performing the step of collectively outputting a first portion of operational data from said memory cells during said normal mode of operation and 1-bits during said test mode of operation; and providing a second plurality of differential amplifiers each coupled to one of a second plurality of output lines of said memory cells, for performing the step of collectively outputting a second portion of said operational data during said normal mode of operation and 0-bits during said test mode of operation.

28. The method in claim 27, providing each of said first plurality of differential amplifiers comprises:

providing a first n-channel transistor having a drain, a gate connected to an output of a respective one of said memory cells, and a source connected to a low voltage source;

providing a first p-channel transistor having a source connected to a high voltage source, a gate, a drain connected to said drain of said first n-channel transistor;

providing a second p-channel transistor having a source connected to said high voltage, a gate connected to said gate of said first p-channel transistor and to said drain of said first n-channel transistor and a drain connected to an output line;

providing a second n-channel transistor having a drain connected to said drain of said second p-channel transistor and to said output line, a gate connected to an inverted input from said respective memory cell, a source connected to said low voltage;

providing a third p-channel transistor having a source connected to said high voltage, a gate connected to said test enable input, and a drain connected to said output line.

29. A method comprising the steps of:

providing an embedded memory array for performing the steps of storing and outputting operational data;

providing a first plurality of multiplexors, each coupled to one of a first plurality of output lines of said memory array and to a 1-bit source, for plurality of output lines of said memory array and to a 1-bit signal source, for performing the step of outputting a first portion of said operational data during said normal mode of operation, and outputting said 1-bit signal during said test mode of operation;

providing a second plurality of multiplexors, each coupled to one of a second plurality of ouptut lines of said memory array and to a 0-bit course for performing the step of outputting a second portion of said operational data during said normal mode of operation, and outputting 0-bit signals during said test mode of operation; and providing sysetm logic for processing said operational data, said sysetm logic circuitry receiving said 0-bit signals and set 1-bit signals during said test mode of operation in a permanent arrangement that represents a fixed value, and receiving said first and second portion of operational data during said normal mode of operation.

* * * * *

UNITED STATES PATENT AND TRADEMARK OFFICE
CERTIFICATE OF CORRECTION

PATENT NO. : 5,341,382
DATED : August 23, 1994
INVENTOR(S) : Levitt

It is certified that error appears in the above-identified patent and that said Letters Patent is hereby corrected as shown below:

In column 15, claim 14 at line 18, please delete " 13 " and insert -- 12 --.

In column 20, claim 29 at lines 22-24, please delete " for plurality of output lines of said memory array and to a 1-bit signal source, --.

Signed and Sealed this

Eighteenth Day of August, 1998

Attest:

BRUCE LEHMAN

*Attesting Officer*                *Commissioner of Patents and Trademarks*